United States Patent
Lee et al.

(10) Patent No.: US 12,464,693 B2
(45) Date of Patent: Nov. 4, 2025

(54) NEGATIVE POTENTIAL INDUCING DEVICE

(71) Applicant: TAIWAN OASIS TECHNOLOGY CO., LTD., Taipei (TW)

(72) Inventors: Ming-Shun Lee, New Taipei (TW); Ming-Der Lin, Hsinchu County (TW)

(73) Assignee: TAIWAN OASIS TECHNOLOGY CO., LTD., Taipei (TW)

( * ) Notice: Subject to any disclaimer, the term of this patent is extended or adjusted under 35 U.S.C. 154(b) by 21 days.

(21) Appl. No.: 18/748,342

(22) Filed: Jun. 20, 2024

(65) Prior Publication Data

US 2024/0431081 A1 Dec. 26, 2024

Related U.S. Application Data

(60) Provisional application No. 63/523,131, filed on Jun. 26, 2023.

(51) Int. Cl.

| | |
|---|---|
| *H05K 5/02* | (2006.01) |
| *H02M 7/00* | (2006.01) |
| *H05K 5/10* | (2025.01) |
| *H05K 9/00* | (2006.01) |
| *H05K 5/03* | (2006.01) |

(52) U.S. Cl.
CPC .......... *H05K 9/0052* (2013.01); *H02M 7/003* (2013.01); *H05K 5/0247* (2013.01); *H05K 5/10* (2025.01); *H05K 5/03* (2013.01)

(58) Field of Classification Search
CPC .................................................. H05K 5/0247
See application file for complete search history.

(56) References Cited

U.S. PATENT DOCUMENTS

| | | | | |
|---|---|---|---|---|
| 4,167,301 A | * | 9/1979 | Mundschenk | H02G 3/0633 439/457 |
| 2003/0137810 A1 | * | 7/2003 | Chen | H05K 5/0247 361/752 |
| 2012/0097425 A1 | * | 4/2012 | Sakai | H01R 13/5833 174/135 |
| 2017/0040734 A1 | * | 2/2017 | Ramones | H04L 12/10 |

FOREIGN PATENT DOCUMENTS

| | | |
|---|---|---|
| CN | 106310524 A | 1/2017 |
| CN | 206081327 B2 | 4/2017 |
| CN | 108283760 A | 7/2018 |
| CN | 111111008 A | 5/2020 |
| TW | M587999 B2 | 12/2019 |

OTHER PUBLICATIONS

Office Action with the first search report for the corresponding TW Appln. 112134396 issued at Jul. 10, 2024.

* cited by examiner

*Primary Examiner* — Hung V Ngo
(74) *Attorney, Agent, or Firm* — Demian K. Jackson; Jackson IPG PLLC

(57) ABSTRACT

A negative potential inducing device has a box body, an AC/DC converter, a booster, a second wire, a lid and an insulating rod. The box body has a side wall, and the side wall has a via. The AC/DC converter is arranged inside the box body, and electrically connected with a plug through a first wire. The booster is arranged inside the box body and electrically connected with the AC/DC converter. The second wire passes through the via, wherein one end of the second wire is electrically connected with the booster. The lid covers the box body. A metal wire on another end of the second wire is exposed and inserted to one end of the insulating rod and touches the insulating rod.

9 Claims, 6 Drawing Sheets

NEGATIVE POTENTIAL INDUCING DEVICE

BACKGROUND

Technical Field

The present disclosure relates to a negative potential device, in particular to a negative potential inducing device used for a human body.

Related Art

Recently, due to the development and industrial acceleration, and further due to the popularization of electronic/electrical products and compact living space, the increasing positive potential in the environment causes the potential balance in the environment to be seriously damaged. Since a current consensus is to use the negative ions to solve the problem of potential balance being destroyed, negative ion generators that artificially provide with negative ions are gradually favored by public, and various related products are also popping out one after another. There are corona discharging and electron radiation types of negative ion generators. The corona discharging (also known as direct current (DC) free corona discharging) negative ion generator applies a high voltage between its negative electrode and induced electrode in the DC loop to form a strong electric field, which destroys the insulation of local air and causes corona discharging, and then the negative electrode will release negative ions. The electron radiation negative ion generator uses a piezoelectric transformer driving circuit to generate negative high voltage, and then applies the negative high voltage to a negative electrode, thereby releasing electrons to generate negative ions. However, the above-mentioned corona discharging negative ion generator also produces excessive pollutants such as ozone and nitric oxide, which harms the human body, while producing negative ions in the air.

In order to prevent the human body from inhaling ozone and nitric oxide, a negative ion generator provided by Taiwan utility model patent No. M367722 (hereinafter referred to as Document 1) seals negative ions, ozone and nitric oxide in a wooden box, and then the human body can touch the wooden box. Document 1 alleges that negative ions may penetrate the wooden box and be transmitted to the human body, but it cannot happen in scientific theories nonetheless. This is because the negative ions are transmitted by air, and when the air is sealed in the box, the negative ions are also sealed in the box. Hence, Document 1 does not meet the scientific theories. Document 1 also encountered another problem that the wooden box body is large and cumbersome to use, and thus the device of Document 1 cannot concentratedly and precisely contact the targeted location or acupuncture points of the human body.

Therefore, the attempt of using the negative ions to solve the potential imbalance in the environment caused by the increase of the positive potential of the environment increases the risk of generating pollutants in implementation. In addition, to seal the negative ions and pollutants in inner space of the wooden box not only fails to meet the scientific theories, but also raise the problem that the device is unable to concentratedly and precisely contact the targeted location or acupuncture points of the human body.

SUMMARY OF THE INVENTION

Based on the above acknowledgement, the inventor of the present disclosure realized that negative potential has the following advantages for human body:

1. Purification of blood: If the negative potential in the body increases, the ionization of calcium and sodium in the blood will be accelerated, making the blood present weak alkalescency (the corresponding pH value is 7.4±0.05), and thus the blood can be purified.
2. Recovery of cells: When negative potential increases, the metabolism gradually becomes normal and revives, and meanwhile the function of cells will obviously improve, nutrients will be easily absorbed, and aged wastes will be easily discharged.
3. Enhancement of resistance and self-healing: When the negative potential increases, globulin in blood will also increase, and therefore the immunity to diseases increase, and the self-healing ability of human body will also increase, which can even inhibit cell inflammation and accelerate the recovery of wounds.
4. Adjustment of autonomic nerve: Almost all organs are controlled by the sympathetic nerve and parasympathetic nerve. For example, the functions of heart, vasoconstriction, pupil dilation and gastrointestinal function are all controlled by the sympathetic nerve. When the tension of sympathetic nerve increases, these functions will be enhanced, and when the tension of parasympathetic nerve increases, there will be opposite effects. These two kinds of nervous systems with opposite effects remain balanced by the autonomic nerve so that the inside environment of the human body will not be affected by the will, and the almost all organs of the human body can function automatically. The negative potential can help adjust the autonomic nerve, and when the autonomic nerve is adjusted to normal, some chronic diseases of the human body will naturally stay away.

Based on the above knowledgement as well as the fact that people tend to be busy in daily life, it is urgent to develop a negative potential inducing device that can be operated and used at any time.

An objective of the present disclosure is to provide a negative potential inducing device which is portable and can generate negative potential anytime and anywhere after being connected to a power supply, so that the operations thereof is easier and more convenient.

Another objective of the present disclosure is to provide a negative potential inducing device which can shield electromagnetic waves when the negative potential is generated, thus preventing the human body or other objects or electrical appliances from being affected by the electromagnetic waves.

In order to solve the above problems, the present disclosure provides a negative potential inducing device which comprises a box body, an alternating current/direct current (AC/DC) converter, a booster, a second wire, a lid and an insulating rod. The box body has a side wall, and the side wall has a via. The AC/DC converter is arranged inside the box body, and electrically connected with a plug through a first wire. The booster is arranged inside the box body and electrically connected with the AC/DC converter. The second wire passes through the via, and one end of the second wire is electrically connected with the booster. The lid covers the box body. A metal wire on another end of the second wire is exposed and inserted to one end of the insulating rod and touches the insulating rod.

In some embodiments, the insulating rod is a wooden rod.

In some embodiments, the metal wire directly contacts an inner wall surface of a blind hole on an end face of the insulating rod.

In some embodiments, a stuffing and fastening part seals the second wire inside the blind hole in order to isolate air inside the blind hole from air outside the blind hole.

In some embodiments, a space between the box body, the AC/DC converter and the booster is stuffed with a plurality of cotton threads.

In some embodiments, the box body and the lid are made of wooden material.

In some embodiments, the AC/DC converter and the booster are fixed inside the box body through an adhesive part.

In some embodiments, another space between the box body, the AC/DC converter, the booster and the cotton threads are stuffed with grapheme.

The present disclosure further provides another negative potential inducing device which comprises an AC/DC converter, a booster, a second wire and a stuffing and fastening part. The AC/DC converter is electrically connected with a plug through a first wire. The booster is electrically connected with the AC/DC converter. One end of the second wire is electrically connected with the booster. A metal wire on another end of the second wire is exposed and contacts the insulating rod contact. The stuffing and fastening part is configured to seal the exposed metal wire of the second wire in the insulating rod, so as to isolate the exposed metal wire from air outside the insulating rod.

The above objects and advantages of the present disclosure can be easily understood from the following detailed description of selected embodiments and the accompanying drawings. The present disclosure will be described in detail in the following examples with the accompanying drawings.

DESCRIPTIONS OF DRAWINGS IN THE INVENTION

DESCRIPTIONS OF EMBODIMENTS IN THE INVENTION

Figure 1:
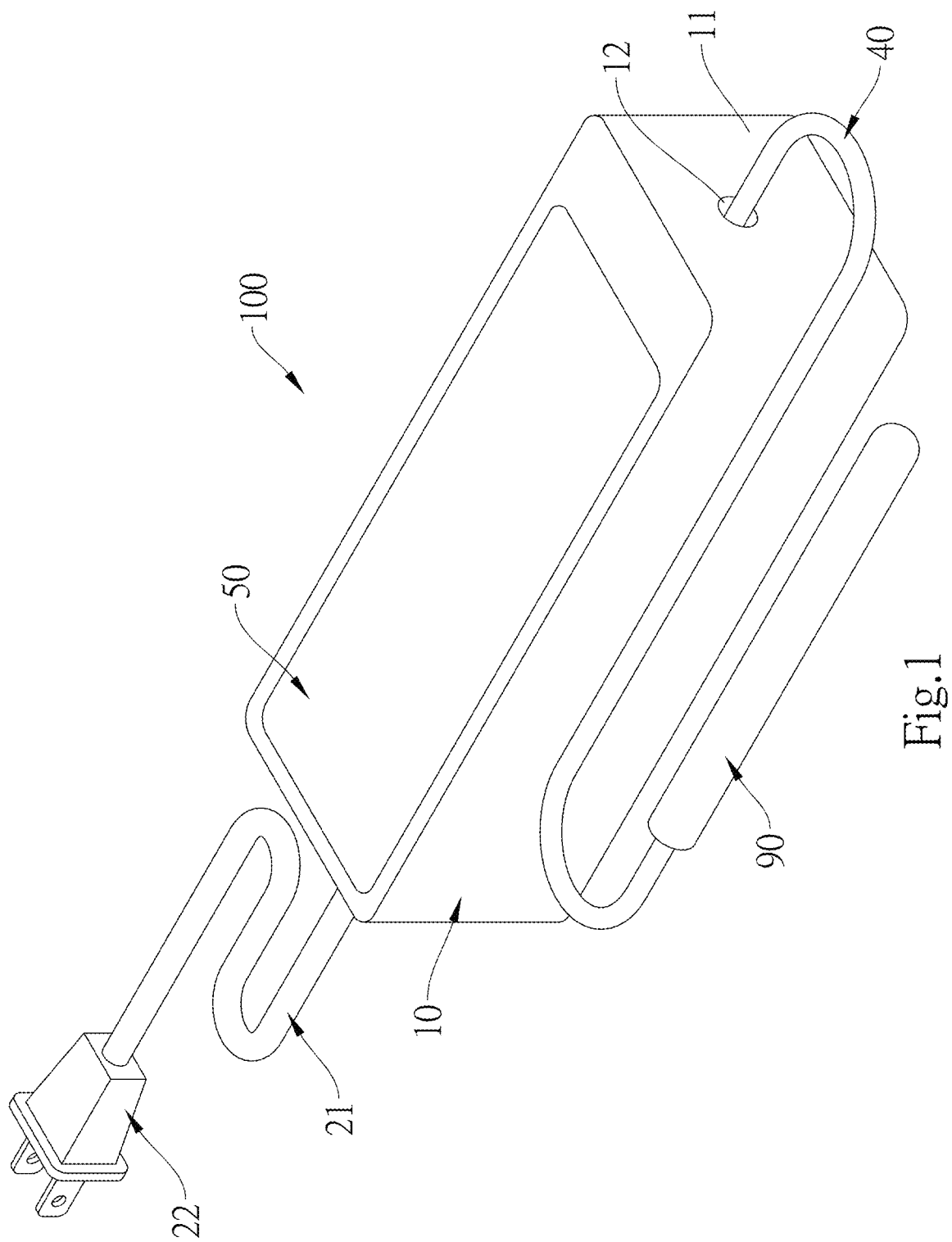
FIG. 1 is a schematic three-dimensional diagram of a negative potential inducing device according to one embodiment of the present disclosure.
Figure 2:
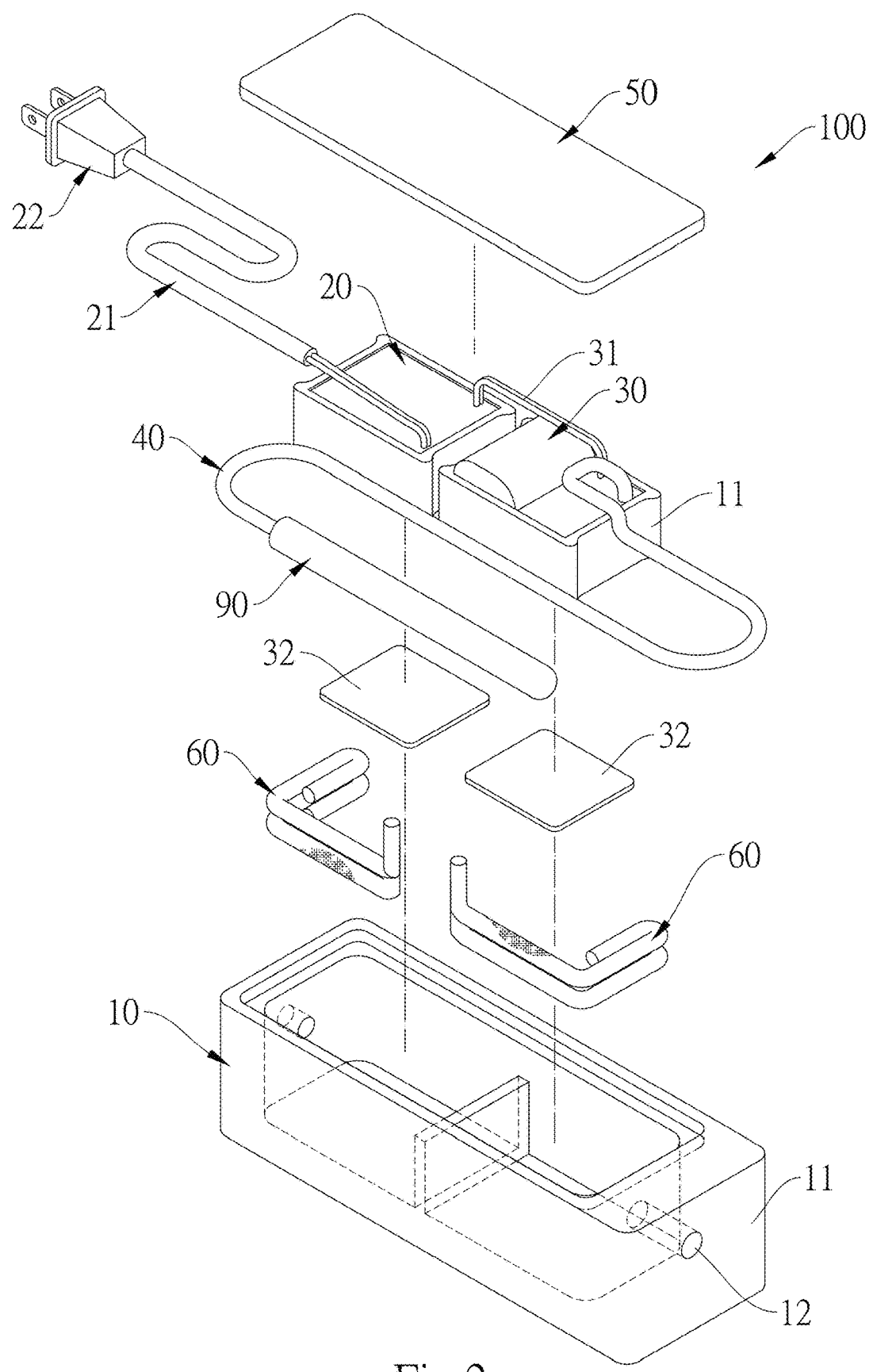
FIG. 2 is a schematic diagram showing an exploded view of a negative potential inducing device according to one embodiment of the present disclosure.
Figure 3:
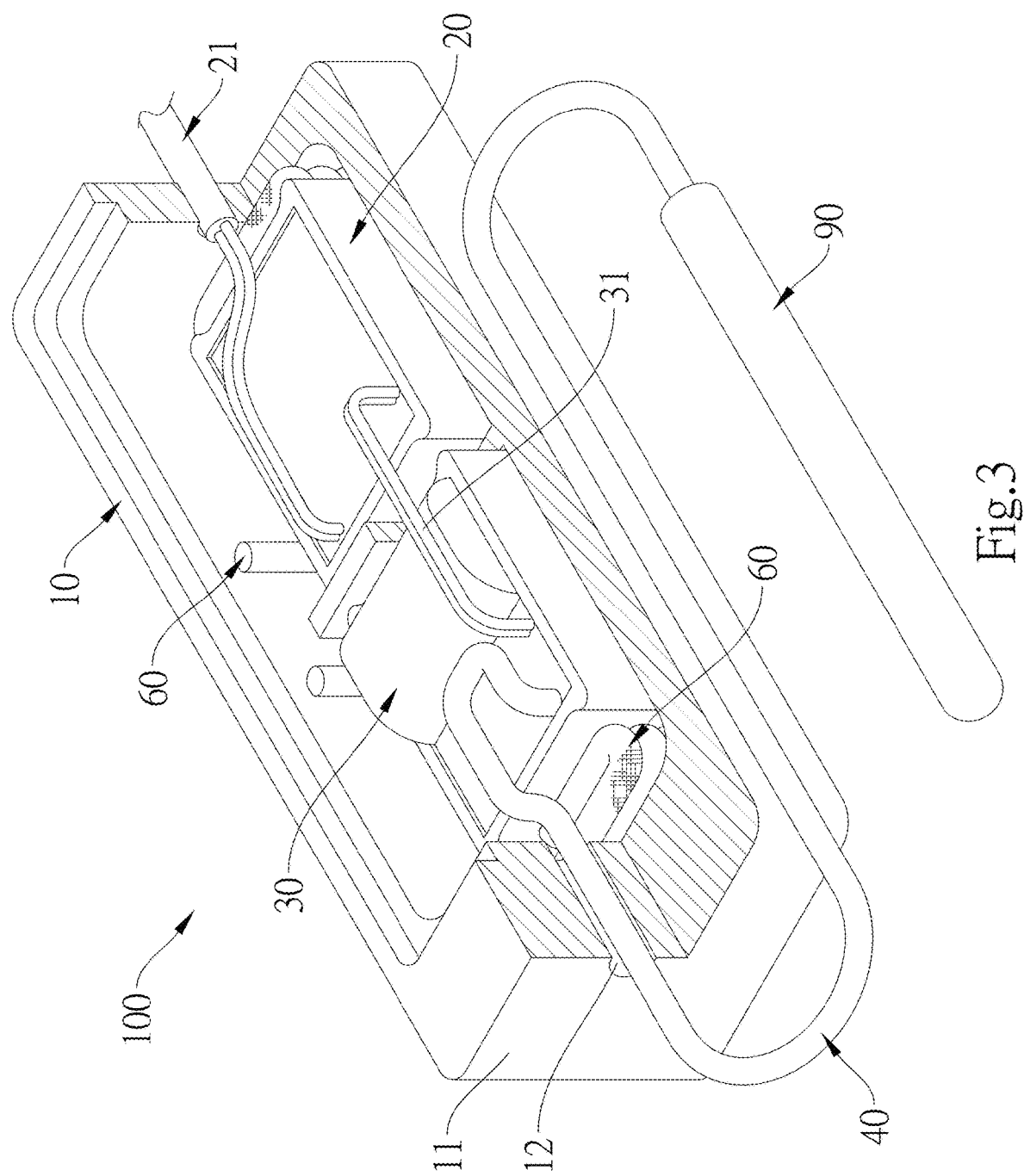
FIG. 3 is a schematic three-dimensional perspective diagram of a negative potential inducing device according to one embodiment of the present disclosure, wherein a part of the negative potential inducing device is cut open.
Figure 4:
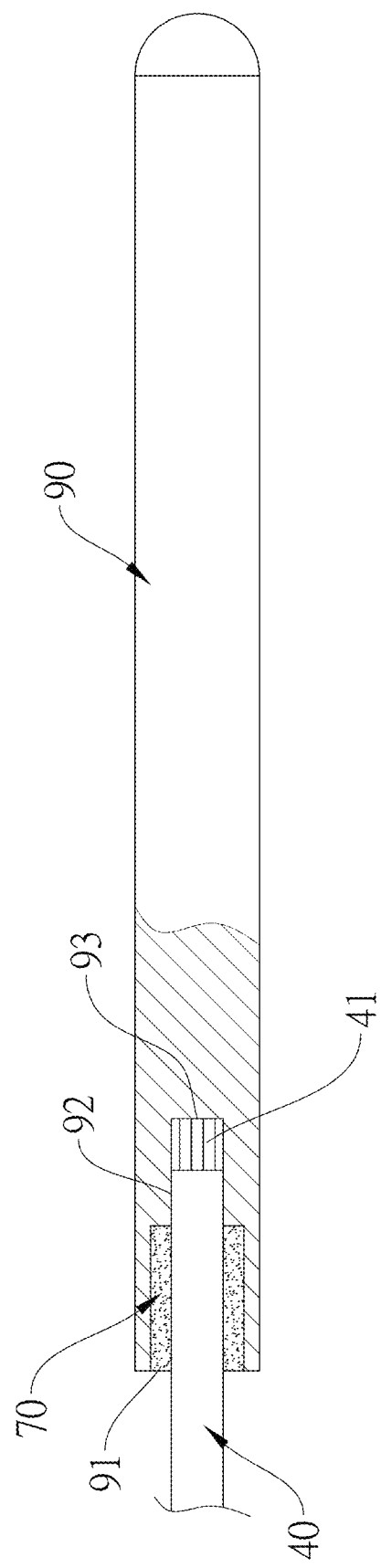
FIG. 4 is a schematic diagram showing a partial cross-sectional view of an insulating rod of a negative potential inducing device according to one embodiment of the present disclosure.

Refer to FIG. 1, FIG. 2, FIG. 3 and FIG. 4. FIG. 1 is a schematic three-dimensional diagram of a negative potential inducing device according to one embodiment of the present disclosure. FIG. 2 is a schematic diagram showing an exploded view of a negative potential inducing device according to one embodiment of the present disclosure. FIG. 3 is a schematic three-dimensional perspective diagram of a negative potential inducing device according to one embodiment of the present disclosure, wherein a part of the negative potential inducing device is cut open. FIG. 4 is a schematic diagram showing a partial cross-sectional view of an insulating rod according to one embodiment of the present disclosure.

As shown in FIG. 1 to FIG. 4, the negative potential inducing device 100 of the present disclosure comprises a box body 10, an AC/DC converter 20, a booster 30, a second wire 40, a lid 50 and an insulating rod 90.

The box body 10 has a side wall 11, and the side wall 11 has a via 12. The lid 50 may cover the box body 10. In some embodiments, the box body 10 and the lid 50 can be made of insulating material, such as wooden material.

The AC/DC converter 20 may be arranged inside the box body 10 and electrically connected with a plug 22 through a first wire 21. A core of each of the first wire 21 and second wire 40 is a metal wire, and an outer layer of the metal wire of each of the first wire 21 and the second wire 40 is covered with an insulation jacking.

The booster 30 may be arranged inside the box body 10 and electrically connected with AC/DC converter 20 through a third wire 31. In some embodiments, The AC/DC converter 20 and the booster 30 are fixed inside the box body 10 through an adhesive part 32. Preferably, the adhesive part 32 may be a 3M® double-sided tape.

The second wire 40 passes through the via 12, in which one end of the second wire 40 is electrically connected with the booster 30, and the other end of the second wire 40 is inserted into one end of the insulating rod 90. That is, the metal wire 41 on the end of the second wire 40 that passes through the via 12 is designed as exposed from the insulation jacking, and is inserted into the insulating rod 90 and directly contacts an inner wall surface 93 of the blind hole 92 on an end face 91 of the insulating rod 90.

In some embodiments, a space between the box body 10, AC/DC converter 20 and booster 30 is stuffed with a plurality of cotton threads 60, in order to prevent the AC/DC converter 20 and booster 30 from swaying or shaking.

In some embodiments, as shown in FIG. 4, a stuffing and fastening part 70 is stuffed or fastened between the second wire 40 and insulating rod 90, so as to stably fix the second wire 40 inside the insulating rod 90, thereby preventing the second wire 40 from sliding out of the insulating rod 90 or shaking or swaying inside the insulating rod 90. The stuffing and fastening part 70 seals the second wire 40 inside the blind hole 92 so that the second wire 40 is in a sealed state, isolating the air inside the blind hole 92 from the air outside the blind hole 92.

In some embodiments, the stuffing and fastening part 70 seals the exposed metal wire 41 of the second wire 40 inside the insulating rod 90 so as to isolate the metal wire 41 from the air outside the insulating rod 90.

Figure 5:
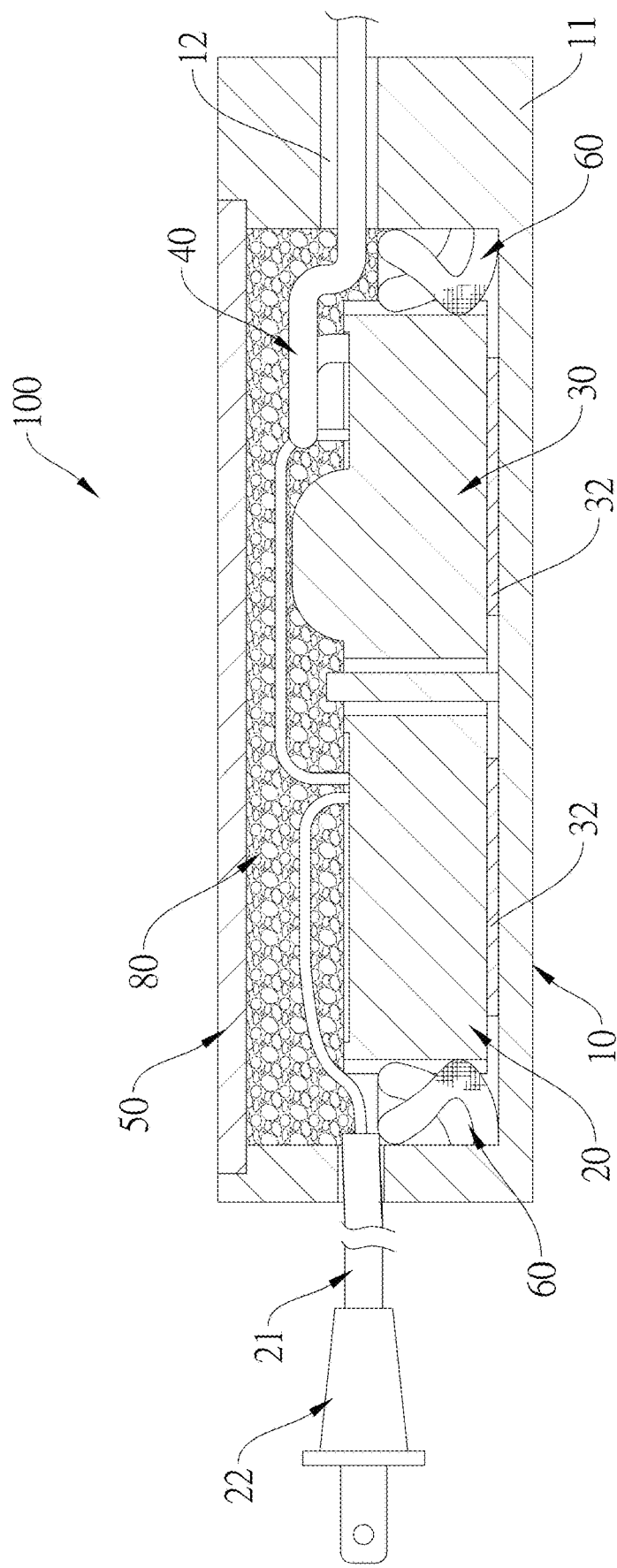
FIG. 5 is a schematic diagram showing that a box body of a negative potential inducing device according to one embodiment of the present disclosure, wherein the box body is provided with grapheme.

Refer to FIG. 5, and FIG. 5 is a schematic diagram showing that a box body of a negative potential inducing device according to one embodiment of the present disclosure, wherein the box body is provided with grapheme. In some embodiments, as shown in FIG. 5, another space between the box body 10 and AC/DC converter 20, booster 30 and cotton threads 60 is stuffed with grapheme 80 to shield the electromagnetic waves generated from the AC/DC converter 20 and booster 30, so as to prevent human bodies from being affected by the electromagnetic waves.

Figure 6:
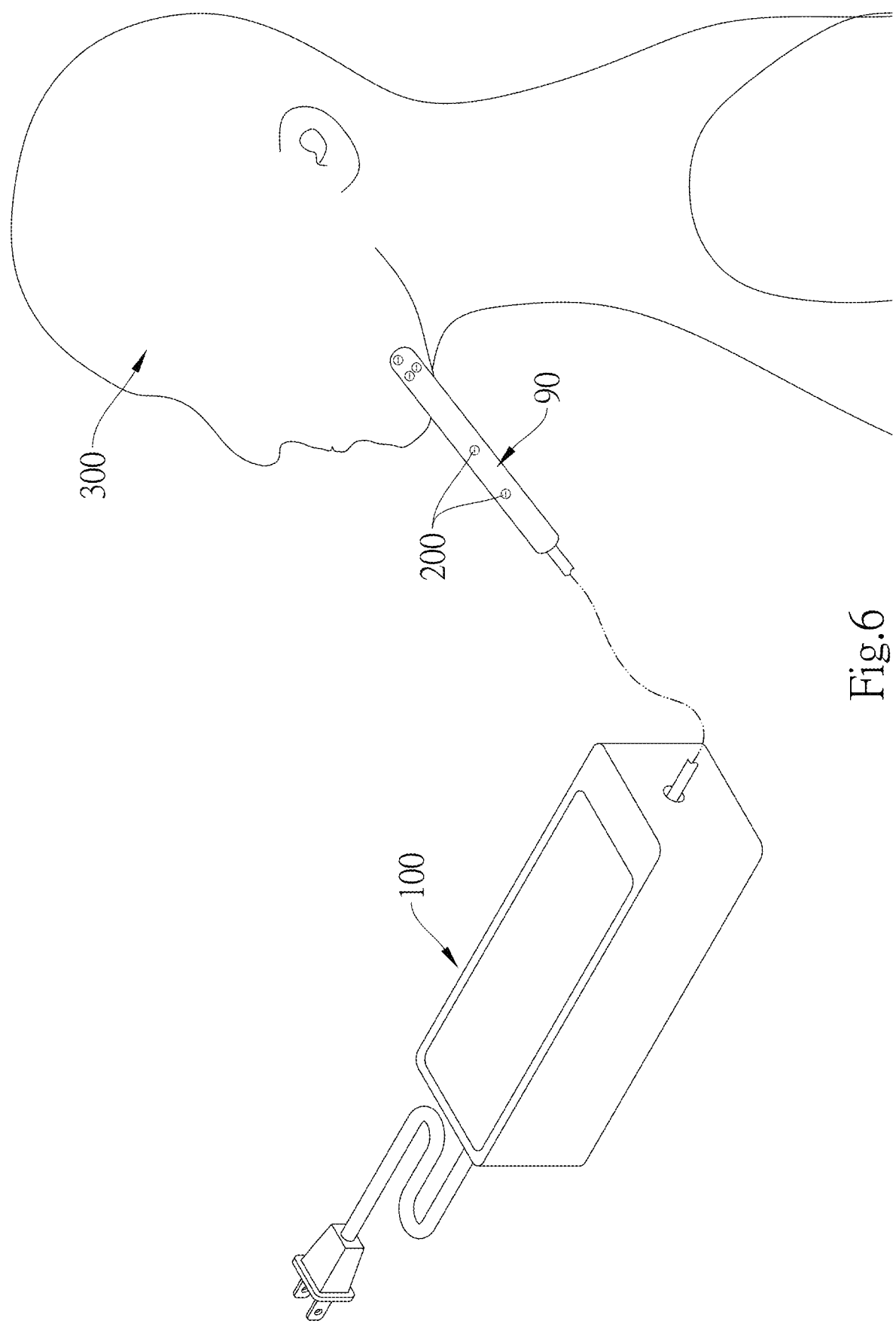
FIG. 6 is a schematic usage diagram showing a negative potential inducing device according to one embodiment of the present disclosure.

Further referring to FIG. 5 and FIG. 6, FIG. 6 is a schematic usage diagram showing a negative potential inducing device according to one embodiment of the present disclosure. When the plug 22 is plugged or connected to a power source (e.g., AC power such as mains power), the AC power flows to the AC/DC converter 20 through the first wire 21, so that the AC power will be converted into DC power. Then, the DC power further flows to the booster 30 through the third wire 31 (as shown in FIG. 3) to boost to 8000 volts for example. The booster 30 is a high-voltage booster, which mainly boosts DC voltage being several volts to over ten volts to thousands of volts.

The high-voltage DC power then passes through the second wire 40 and reaches the metal wire 41 on one end of the second wire 40, wherein the metal wire 41 is inserted into the insulating rod 90, as shown in FIG. 4. When the insulating rod 90 is a wooden rod, the resistivity of the wood is $10^6$ to $10^7$ Ω·m. If the cross-sectional area of the insulating rod 90 is designed to be 0.0001 square meters (m$^2$) and the length of the insulating rod 90 is designed to be 0.1 meter (m), the resistance of the insulating rod 90 will be $10^8$ to $10^9$ ohms, e.g., between 1000 MΩ and 10000 MΩ. Therefore, if the DC voltage is 8000 volts and the insulating rod 90 is grounded, a small current will be generated. Given that the resistance of the insulating rod 90 is 8000 MΩ, the extremely small current will be generated current, such as 0.001 mA. Due to the extremely high resistance of the insulating rod 90, when the insulating rod 90 is grounded, it disperses most of the high voltage, and only the extremely small current flows to the ground terminal. That is, even when the insulating rod 90 contacts a person, because the current is extremely small (e.g., 0.001 mA), the human body will not be harmed by the electric shock.

As can be seen from the above, the insulating rod 90 cannot conduct electricity effectively, which causes the insulating rod 90 to become electrically polarized and generate a negative potential 200. The metal wire 41 of the second wire 40 contacts an inner wall surface 93 of the blind hole 92 on the end face 91 of the insulating rod 90. The tip of the metal wire 41 of the second wire 40 has the extremely high voltage. Since the insulating rod 90 is a medium with high insulation coefficient, the part of the insulating rod 90 near the blind hole 92 and the inner wall surface 93 receives a large amount of positive charges, and causes multiple negative charges to be induced on the outer surface of the insulating rod 90, thereby generating the above-mentioned negative potential 200. In short, the insulating rod 90 is electrically polarized so that the negative potential 200 is transferred to the outer surface of the insulating rod 90 and the surface of an object in contact with the insulating rod 90.

When the insulating rod 90 of the negative potential inducing device 100 of the present disclosure touches the human body 300, the negative potential 200 can be transferred to the human body 300. Since the metal wire 41 of the second wire 40 contacts the inner wall surface 93 of the blind hole 92, the problem encountered in Document 1 that the metal wire is exposed to the air inside the box and thus generates negative ions can be avoided. It is noted that, the negative potential inducing device 100 of the present disclosure is mainly to generate the negative potential rather than the negative ions. In addition, since the stuffing and fastening part 70 seals the second wire 40 in the blind hole 92 to isolate the air inside the blind hole 92 from the air outside the blind hole 92, if there are pollutants such as ozone or nitric oxide generated, the pollutants will not be transferred to the outside the insulating rod 90 to form environmental pollution of another kind and harm human bodies. In addition, the stuffing and fastening part 70 can also reduce the amount of air in the blind hole 92, thereby reducing the possibility of generating negative ions and pollutants, such as, ozone or nitric oxide.

Through the above structures, the negative potential inducing device 100 of the present disclosure is easy to carry and may generate the negative potential 200 anytime and anywhere after being connected to the power source, making the operation thereof easier and more convenient. Furthermore, with the configuration of the grapheme 80, the electromagnetic waves can be shielded while the negative potential inducing device 100 is operating, so as to prevent the human body, or other objects or electrical appliances from being affected by the electromagnetic waves.

The invention claimed is:

1. A negative potential inducing device, comprising:
   a box body with a side wall, wherein the side wall has a via;
   an AC/DC converter arranged inside the box body and electrically connected with a plug through a first wire;
   a booster arranged inside the box body and electrically connected with the AC/DC converter;
   a second wire passing through the via, and one end of the second wire is electrically connected with the booster;
   a lid covering the box body; and
   an insulating rod, wherein a metal wire of another end of the second wire is exposed and inserted to one end of the insulating rod and touches the insulating rod.

2. The negative potential inducing device according to claim 1, wherein the insulating rod is a wooden rod.

3. The negative potential inducing device according to claim 1, wherein the metal wire directly contacts an inner wall surface of a blind hole on an end face of the insulating rod.

4. The negative potential inducing device according to claim 3, wherein a stuffing and fastening part seals the second wire inside the blind hole to isolate air inside the blind hole from air outside the blind hole.

5. The negative potential inducing device according to claim 1, wherein a space between the box body, the AC/DC converter and the booster is stuffed with a plurality of cotton threads.

6. The negative potential inducing device according to claim 5, wherein another space between the box body, the AC/DC converter, the booster and the cotton threads are stuffed with grapheme.

7. The negative potential inducing device according to claim 1, wherein the box body and the lid are made of wooden material.

8. The negative potential inducing device according to claim 1, wherein the AC/DC converter and the booster are fixed inside the box body through an adhesive part.

9. A negative potential inducing device, comprising:
   an AC/DC converter electrically connected with a plug through a first wire;
   a booster electrically connected with the AC/DC converter;
   a second wire with one end electrically connected with the booster;
   an insulating rod, wherein a metal wire on another end of the second wire is exposed and contacts the insulating rod; and
   a stuffing and fastening part configured to seal the exposed metal wire of the second wire inside the insulating rod in order to isolate the exposed metal wire from air outside the insulating rod.

\* \* \* \* \*